United States Patent
Greywall (10) Patent No.: US 7,042,213 B2
(45) Date of Patent: May 9, 2006

(54) MAGNETOMETER HAVING AN ELECTROMECHANICAL RESONATOR

(75) Inventor: Dennis S. Greywall, Whitehouse Station, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 20 days.

(21) Appl. No.: 10/889,970

(22) Filed: Jul. 13, 2004

(65) Prior Publication Data

US 2006/0033585 A1    Feb. 16, 2006

(51) Int. Cl.
*G01R 33/02*    (2006.01)
*H03B 5/30*    (2006.01)

(52) U.S. Cl. ......................................... 324/244; 331/65
(58) Field of Classification Search .................. 331/65; 324/244
See application file for complete search history.

(56) References Cited

U.S. PATENT DOCUMENTS

| | | | |
|---|---|---|---|
| 5,442,288 A * | 8/1995 | Fenn et al. .................. | 324/244 |
| 5,644,230 A | 7/1997 | Pant et al. ................... | 324/247 |
| 5,731,703 A | 3/1998 | Bernstein et al. ........... | 324/256 |
| 5,998,995 A | 12/1999 | Osiander et al. ............ | 324/259 |
| 6,714,007 B1 * | 3/2004 | Youngner ................ | 324/244.1 |

OTHER PUBLICATIONS

"Theory of Amplifier-Noise Evasion in an Oscillator Employing a Nonlinear Resonator," by B. Yurke et al., Physical Review A, May 1995, vol. 51, No. 5, pp. 4211-4229.

* cited by examiner

*Primary Examiner*—David Mis (57) ABSTRACT

In one embodiment, a magnetometer includes an electromechanical resonator coupled to a drive-and-detect (DD) circuit. The resonator has a deformable beam that is a part of a closed current path. By applying a periodic drive signal to a drive electrode located in proximity to the deformable beam, the DD circuit induces an oscillation of the beam. In the presence of a magnetic field, this oscillation changes the magnetic flux through the closed current path, thereby generating an oscillating electrical current in the path. Dissipation of this current due to resistive losses in the closed current path then dampens the oscillation of the deformable beam with a damping coefficient that depends on the magnetic-field strength. Using a sense electrode located in proximity to the deformable beam, the DD circuit detects the oscillation amplitude. Based on the detected amplitude, the DD circuit changes the frequency of the drive signal to find the resonant frequency. Since the resonant frequency depends on the damping coefficient, the magnetic-field strength can be deduced in a relatively straightforward manner from the resonant frequency.

41 Claims, 7 Drawing Sheets

MAGNETOMETER HAVING AN ELECTROMECHANICAL RESONATOR

BACKGROUND OF THE INVENTION

1. Field of the Invention

The present invention relates to magnetometers and, more specifically, to magnetometers based on electromechanical resonators. The present invention also relates to micro-electromechanical systems (MEMS).

2. Description of the Related Art

Magnetometers are widely used in a variety of applications, such as extraterrestrial exploration, industrial process sensors, medical imaging equipment, scientific equipment, and detection of mineral deposits and submerged ships. The current trend in magnetometer design and development is consistently toward smaller size, lower power consumption, and lower cost for a desired set of performance characteristics. Examples of prior-art miniature magnetometers can be found in U.S. Pat. Nos. 5,998,995, 5,731,703, and 5,644,230, the teachings of all of which are incorporated herein by reference.

One problem with prior-art miniature magnetometers is that they typically include strong micro-magnets, either permanent or electric. Permanent micro-magnets require magnetic (e.g., ferromagnetic and/or magnetostrictive) materials that are relatively difficult to process and integrate into the magnetometer structure with conventional micro-fabrication techniques. Micro-electromagnets, while relatively easy to manufacture, require passage of electrical current, which may cause excessive heating and/or unacceptably high power consumption.

SUMMARY OF THE INVENTION

Problems in the prior art are addressed, in accordance with the principles of the present invention, by a miniature magnetometer having an electromechanical resonator whose resonant frequency is a function of the magnetic-field strength to be measured and deducing the strength of the magnetic field from the oscillation of the resonator. In one embodiment, the electromechanical resonator is coupled to a drive-and-detect (DD) circuit and has a deformable beam that is a part of a closed current path. By applying a periodic drive signal to a drive electrode located in proximity to the deformable beam, the DD circuit induces an oscillation of the beam. In the presence of a magnetic field, this oscillation changes the magnetic flux through the closed current path, thereby generating an oscillating electrical current in the path. Dissipation of this current due to resistive losses in the closed current path then dampens the oscillation of the deformable beam with a damping coefficient that depends on the magnetic-field strength. Using a sense electrode located in proximity to the deformable beam, the DD circuit detects the oscillation amplitude. Based on the detected amplitude, the DD circuit changes the frequency of the drive signal to find the resonant frequency (i.e., the frequency corresponding to a maximum oscillation amplitude). Since the resonant frequency depends on the damping coefficient, the magnetic-field strength can be deduced in a relatively straight-forward manner from the resonant frequency. Advantageously, a magnetometer of the invention does not require micro-magnets in the magnetometer structure and can be implemented using a MEMS device fabricated with conventional micro-fabrication techniques.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Magnetometer

Figure 1:
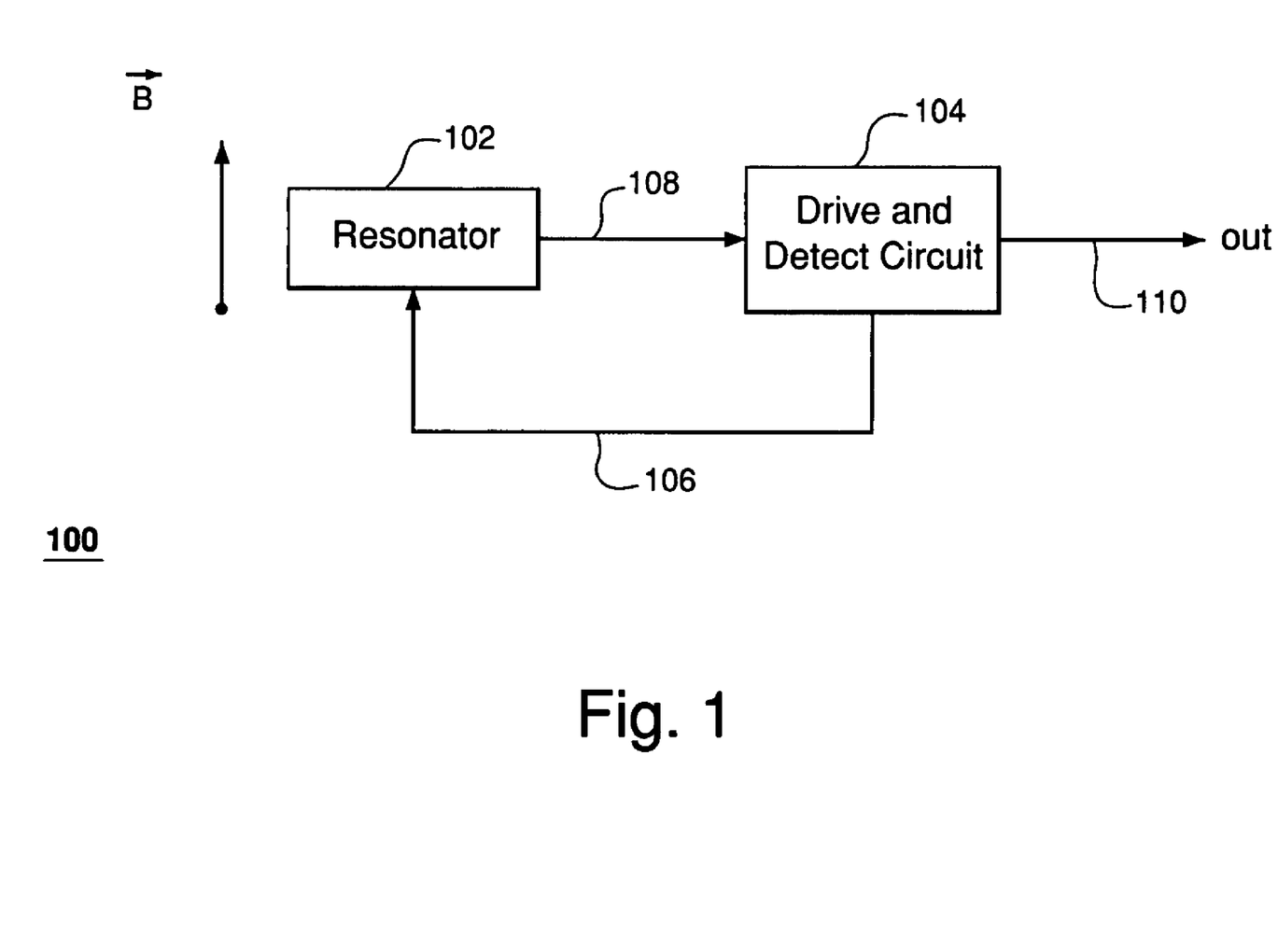
FIG. 1 shows a block diagram of a magnetometer according to one embodiment of the present invention.

FIG. 1 shows a block diagram of a magnetometer 100 according to one embodiment of the present invention. Magnetometer 100 includes an electromechanical resonator 102 coupled to a drive-and-detect (DD) circuit 104. Resonator 102 is a nonlinear resonator having a relatively large Q-factor. As will be explained in more details below, for resonators with relatively large Q-factors, one distinction between a linear resonator and a nonlinear resonator lies in the dependence of the resonant frequency on the resonator's Q-factor. More specifically, while the resonant frequency is substantially independent of the value of the Q-factor in a linear resonator, the opposite is true in a nonlinear resonator. Because resonator 102 is a nonlinear resonator, a change in the resonator's Q-factor results in a shift of the resonant frequency. As further detailed below, resonator 102 is designed such that its Q-factor depends on the magnetic field, B, in which the resonator is placed. A detailed description of how to obtain the value of B from the measured value of resonant frequency is provided in the next section.

DD circuit 104 is adapted to measure the value of the resonant frequency in resonator 102. More specifically, DD circuit 104 applies an electrical drive signal 106 to resonator 102 that excites mechanical oscillations in the resonator. These mechanical oscillations cause resonator 102 to generate an electrical response signal 108 that is fed back to DD circuit 104. In one embodiment, DD circuit 104 is adapted to generate drive signal 106 and process response signal 108 such that, based on these signals, the DD circuit is able to determine the value of the resonant frequency for resonator 102. This value is then output from DD circuit 104 via an output signal 110 to an external processor (not shown) that may then, based on the output signal, derive the value of B.

In an alternative embodiment, DD circuit 104 has an internal processor adapted to produce output signal 110 that directly represents (e.g., in a digital form) the value of B.

In one embodiment, DD circuit 104 is designed to operate in a closed loop with resonator 102. In closed-loop operation, the phase of drive signal 106 is locked with respect to the phase of response signal 108. DD circuit 104 is designed to automatically tune to and lock onto a frequency value at which the amplitude of response signal 108 is at a maximum. As such, in closed-loop operation, the operating frequency of DD circuit 104 typically represents the current resonant frequency in resonator 102.

In another embodiment, DD circuit 104 is designed to operate in an open loop with resonator 102. In open-loop operation, the phase of drive signal 106 is not locked with respect to the phase of response signal 108. To determine the value of the resonant frequency for resonator 102 in an open loop, DD circuit 104 sweeps the frequency of drive signal 106 over a specified range and determines the amplitude of response signal 108 as a function of frequency. A frequency value corresponding to the amplitude maximum is then selected by DD circuit 104 as the current value of the resonant frequency for resonator 102.

In yet another embodiment, DD circuit 104 is designed to be configurable to operate in either an open-loop or a closed-loop mode with resonator 102. Depending on a particular application, an operator of magnetometer 100 may select a desired mode of operation for the magnetometer from these modes.

Figure 2:
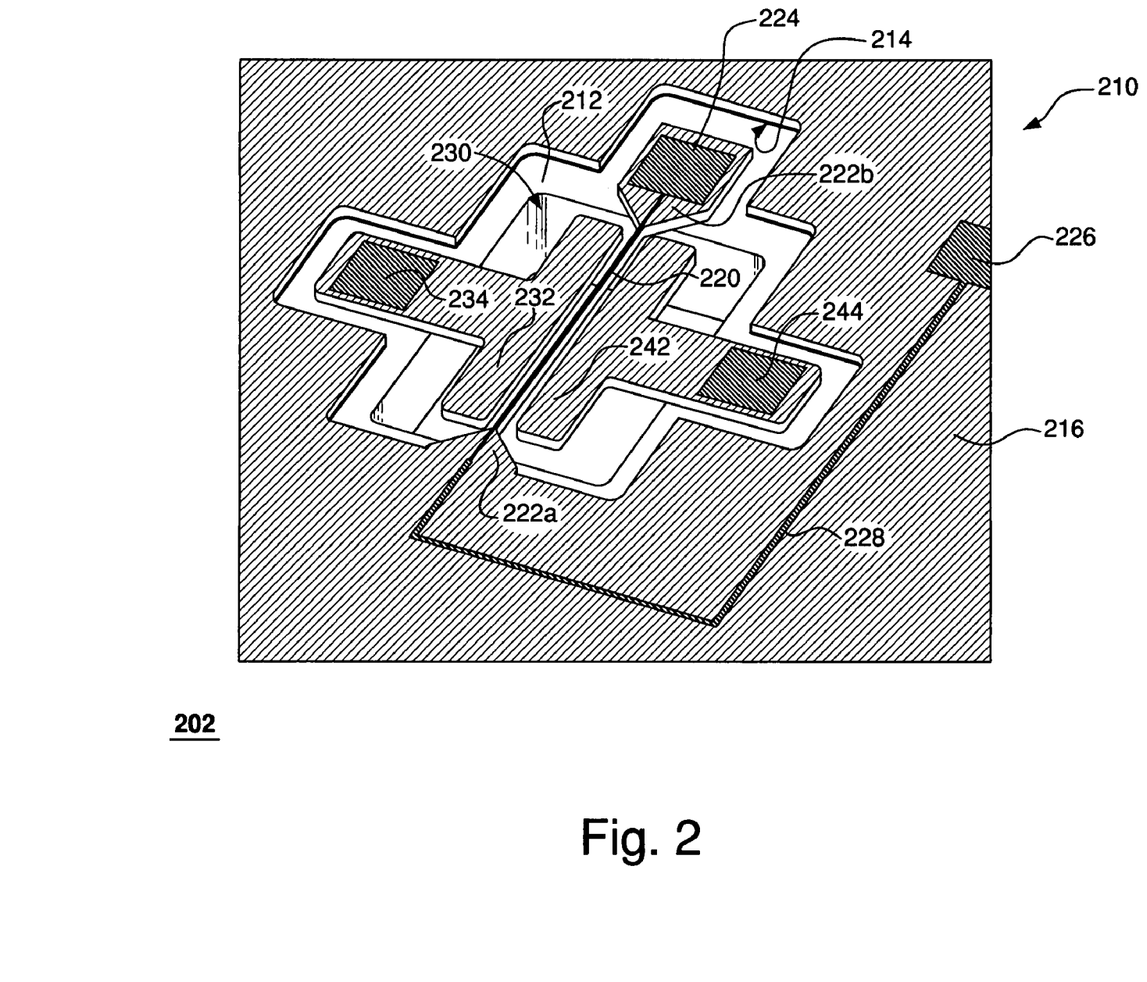
FIG. 2 shows a perspective three-dimensional view of an electromechanical resonator that can be used in the magnetometer of FIG. 1 according to one embodiment of the invention.

FIG. 2 illustrates a perspective three-dimensional view of an electromechanical resonator 202 that can be used as resonator 102 in magnetometer 100 according to one embodiment of the invention. Resonator 202 is fabricated using a silicon-on-insulator (SOI) wafer 210. Wafer 210 has (i) two silicon layers, i.e., a substrate layer 212 and an overlayer 216, and (ii) a silicon oxide layer 214 located between overlayer 216 and substrate layer 212. Substrate layer 212 provides support for the resonator structure; silicon oxide layer 214 provides electrical insulation between overlayer 216 and substrate layer 212; and overlayer 216 is used to define certain structural elements of the resonator, each of which elements is described in more detail below.

Resonator 202 includes a deformable beam 220 attached between support wedges 222a–b. Support wedge 222a is a part of overlayer 216, and support wedge 222b is a part of a contact pad 224 that is formed from overlayer 216. Portions of the top surface of contact pad 224 and the top surface of beam 220 are optionally covered by a thin metal (e.g., gold) film for better electrical conductivity. The metal film is in direct electrical contact with contact pad 224. The metal film may either be in direct electrical contact with the material of beam 220 or, alternatively, be electrically insulated from the beam by a thin dielectric layer deposited between the beam and the metal film. A contact pad 226 that is similar to contact pad 224 is electrically connected to beam 220 via a conducting track 228. A portion of the top surface of contact pad 226 may optionally be covered by a thin film of metal (e.g., gold) for better electrical conductivity. Note that contact pad 226 is in direct electrical contact with overlayer 216.

In one embodiment, conducting track 228 is formed by etching grooves in overlayer 216 through to oxide layer 214 below, which grooves electrically isolate the conducting track from the rest of the overlayer. In another embodiment, conducting track 228 is formed by depositing a thin metal film over the path of the track with a thin dielectric layer deposited between overlayer 216 and the metal film of conducting track 228 such that the metal film is electrically isolated from the underlying portion of overlayer 216.

When a resistor load (not shown) is connected between contact pads 224 and 226 (e.g., with one terminal of the resistor load connected to contact pad 224 and the other terminal of the resistor load connected to contact pad 226), this resistor load together with deformable beam 220 and conducting track 228 form a closed current path. When resonator 202 is placed in a magnetic field, any change in the magnetic flux through the closed current path produces a current that flows along the closed path in a direction corresponding to the flux change. More specifically, for a particular magnetic field orientation with respect to resonator 202, when the magnetic flux increases, the current flows along the closed path in the clockwise direction in the view of FIG. 2. Alternatively, when the magnetic flux decreases, the current flows along the closed path in the counterclockwise direction. Mechanical oscillations of deformable beam 220, e.g., within the plane defined by overlayer 216, produce periodic changes in the area of the closed current path and, therefore, periodic changes in the magnetic flux. Thus, in the presence of a magnetic field, mechanical oscillations of deformable beam 220 produce an oscillating current in the closed current path formed by deformable beam 220, conducting track 228, and the resistor load connected between contact pads 224 and 226.

Resonator 202 further includes a drive electrode 232 and a sense electrode 242, both located in proximity to deformable beam 220 as shown in FIG. 2. In one embodiment, each of electrodes 232 and 242 is a T-shaped electrode attached at its base to substrate layer 212 and overhanging an opening 230 in wafer 210. Opening 230 is formed, e.g., by removing corresponding portions of substrate layer 212 and silicon oxide layer 214. Each of electrodes 232 and 242 is fabricated from overlayer 216 and is electrically isolated from (i) substrate layer 212 by the underlying portions of silicon oxide layer 214 at the base of the electrode and (ii) the rest of overlayer 216 by the openings in overlayer 216 that surround the electrode. As such, each of electrodes 232 and 242 can be independently biased with respect to deformable beam 220, substrate layer 212, and the rest of overlayer 216. In one embodiment, for better electrical conductivity, electrodes 232 and 242 have contacts pads 234 and 244, respectively, each pad located at the base of the corresponding electrode. Each of pads 234 and 244 can be formed, e.g., by depositing a thin film of metal (e.g., gold) over a portion of the electrode's top surface.

In a representative configuration, contact pad 226, substrate layer 212, and overlayer 216 are at a reference (e.g., ground) potential. A voltage differential between drive electrode 232 and contact pad 226 corresponds to drive signal 106 (FIG. 1), and a voltage differential between sense electrode 242 and contact pad 226 corresponds to response signal 108 (FIG. 1).

Figure 3:
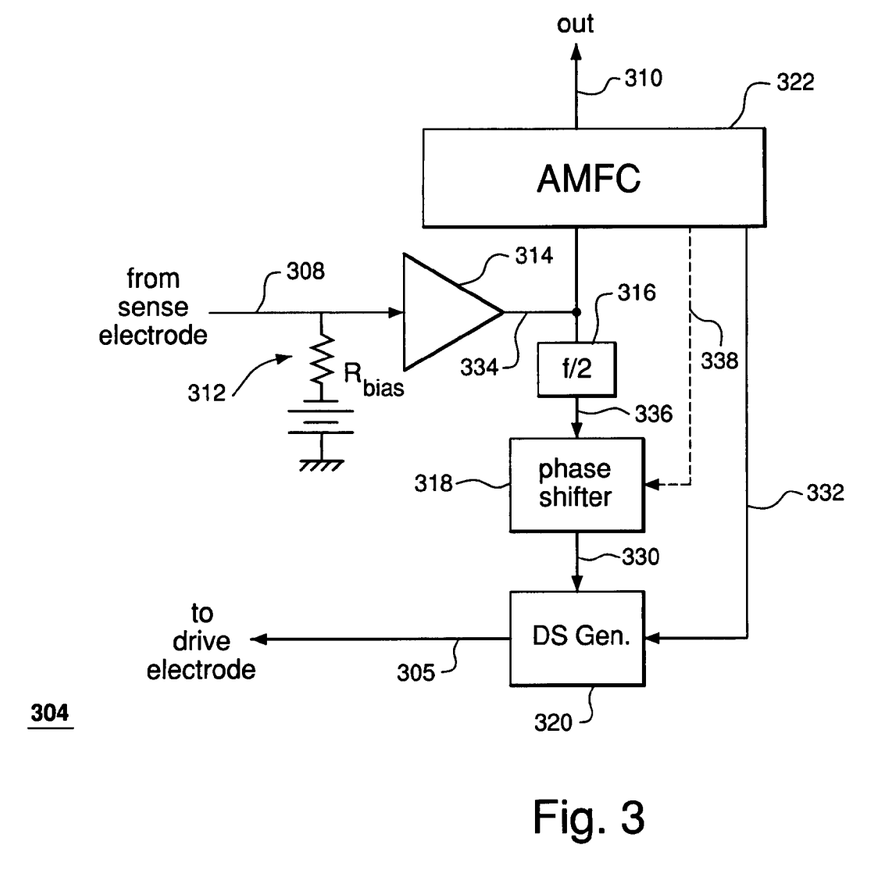
FIG. 3 shows a block diagram of a drive-and-detect (DD) circuit that can be used in the magnetometer of FIG. 1 according to one embodiment of the present invention.

FIG. 3 shows a block diagram of a DD circuit 304 that can be used as DD circuit 104 in magnetometer 100 according to one embodiment of the present invention. More specifically, DD circuit 304 is designed to operate in a closed loop with an electromechanical resonator, e.g., resonator 202 (FIG. 2). In a representative configuration, DD circuit 304 generates a drive signal 306 that is applied to drive electrode 232 (FIG. 2) and receives a response signal 308 from sense electrode 242 (FIG. 2). Based on response signal 308, DD circuit 304 generates an output signal 310 that represents the value of the resonant frequency in resonator 202 (FIG. 2).

DD circuit 304 has a drive signal (DS) generator 320 adapted to generate drive signal 306.

In one configuration, drive signal 306 is a non-biased periodic (e.g., sinusoidal) signal, i.e., a signal oscillating about a zero (ground) potential. The phase of drive signal 306 is determined by the phase of signal 330 generated by a phase shifter 318, and the frequency of drive signal 306 is determined by a control signal 332 generated by an amplitude measurement and frequency control (AMFC) circuit 322. DS generator 320 is designed to keep the amplitude of drive signal 306 at a constant level substantially independent of the phase and frequency of the drive signal.

When periodic drive signal 306 is applied to drive electrode 232 (FIG. 2), it generates an oscillating attractive force between the drive electrode and deformable beam 220, which causes the deformable beam to oscillate about an equilibrium position corresponding to the time-averaged value of the attractive force. Since the attractive force is proportional to the square of the voltage differential between drive electrode 232 and deformable beam 220, the time-averaged force value is generally not zero, and the oscillation of the deformable beam has a second harmonic of drive signal 306.

Due to the oscillation of deformable beam 220, the capacitance of the capacitor formed by the deformable beam and sense electrode 242 (hereafter referred to as the sense capacitor) becomes time dependent. When both resistance $R_{bias}$ in a bias generator 312 and the input impedance of a fixed-gain amplifier 314 in DD circuit 304 are relatively large, charge stored in the sense capacitor is substantially time-independent. A substantially constant charge stored in the time-dependent sense capacitor causes the voltage across the sense capacitor to oscillate with (i) the same frequency as that of deformable beam 220 and (ii) an oscillation amplitude proportional to the oscillation amplitude of the deformable beam. Since response signal 308 substantially corresponds to the voltage across the sense capacitor, the response signal is a periodic signal oscillating about the bias voltage level provided by bias generator 312 and having an amplitude proportional to the oscillation amplitude of deformable beam 220.

Response signal 308 is amplified in fixed-gain amplifier 314 and an amplified signal 334 is applied to both AMFC circuit 322 and a frequency divider 316. Frequency divider 316 divides the frequency of amplified signal 334 by a factor of two and applies a frequency-divided signal 336 to phase shifter 318. Note that signal 336 has the same frequency as drive signal 306, and the phase of signal 336 has a fixed relationship to the phase of drive signal 306. Phase shifter 318 is a configurable circuit adapted to generate signal 330 based on signal 336 such that the phase difference between these two signals is at a fixed selected value. In one embodiment, phase shifter 318 is manually configurable to select the value of the phase shift between signals 336 and 330. In an alternative embodiment, the value of the phase shift between signals 336 and 330 is determined by an optional control signal 338 generated by AMFC circuit 322. As further demonstrated below, for an electromechanical resonator having a relatively large Q-factor, the relative phase shift between drive signal 330 and frequency-divided signal 336 is typically selected to be about 90 degrees, wherein the frequency-divided signal lags the drive signal. However, it is also possible to operate DD circuit 304 using a phase shift value that is different from 90 degrees.

AMFC circuit 322 is designed to measure the amplitude of amplified signal 334 and, based on the measurement, generate control signal 332 applied to DS generator 320 and, optionally, control signal 338 applied to phase shifter 318. More specifically, control signals 332 and 338 are generated such that the amplitude of amplified signal 334 is substantially maximized. As a result, DD circuit 304 automatically tunes to and operates at the resonant frequency of the electromechanical resonator (e.g., resonator 202), to which the DD circuit is coupled.

One skilled in the art will appreciate that DD circuit 304 can alternatively be configured to generate drive signal 306 such that the drive signal is a biased periodic signal, i.e., a signal oscillating about a selected bias voltage without change in the signal polarity throughout the oscillation period. In this configuration, response signal 308 has the same frequency as drive signal 306, and frequency divider 316 may be bypassed or removed from DD circuit 304. However, the configuration based on a non-biased drive signal 306 may be advantageous over the configuration based on a biased signal 306 because having a frequency difference between drive signal 306 and response signal 308 reduces possible detrimental effects of inter-electrode crosstalk in the electromechanical resonator on the operation of DD circuit 304.

Physical Principles of Operation

A. Relationship between Resonant Frequency and Q-Factor.

In this sub-section, the relationship between the values of the resonant frequency and the Q-factor is derived for linear and nonlinear oscillators. A linear oscillator is treated first, which treatment is followed by a similar treatment of a nonlinear oscillator.

Motion of a damped linear oscillator that is driven by a periodic driving force is governed by Eq. (1) as follows:

$$m\frac{d^2y}{dt^2} + \Gamma\frac{dy}{dt} + k_1 y = F_o e^{i\omega t} \qquad (1)$$

where y and t are the displacement and time, respectively; m is the mass; $\Gamma$ s the damping coefficient; $k_1$ is the linear spring constant; $F_0$ is the amplitude of the driving force; and $\omega$ is circular frequency. Defining the fundamental frequency $f_0$ and the Q-factor Q using Eqs. (2) and (3), respectively, as follows:

$$2\pi f_0 \equiv \omega_0 \equiv \sqrt{\frac{k_1}{m}} \qquad (2)$$

$$Q \equiv \frac{\omega_0 m}{\Gamma} \qquad (3)$$

and assuming the solution of Eq. (1) in the form given by Eq. (4):

$$y = A e^{i(\omega t + \phi)} \qquad (4)$$

where A is the amplitude of the displacement of mass m, and φ is the phase of the displacement with respect to the phase of the driving force, one finds that:

$$A^2 = \frac{\left(\frac{F_o}{m\omega_o^2}\right)^2}{\left(\frac{\omega_o^2 - \omega^2}{\omega_o^2}\right)^2 + \left(\frac{\omega}{Q\omega_o}\right)^2} \quad (5)$$

$$\phi = \tan^{-1}\frac{-\omega\omega_o}{Q(\omega_o^2 - \omega^2)} \quad (6)$$

Figure 4:
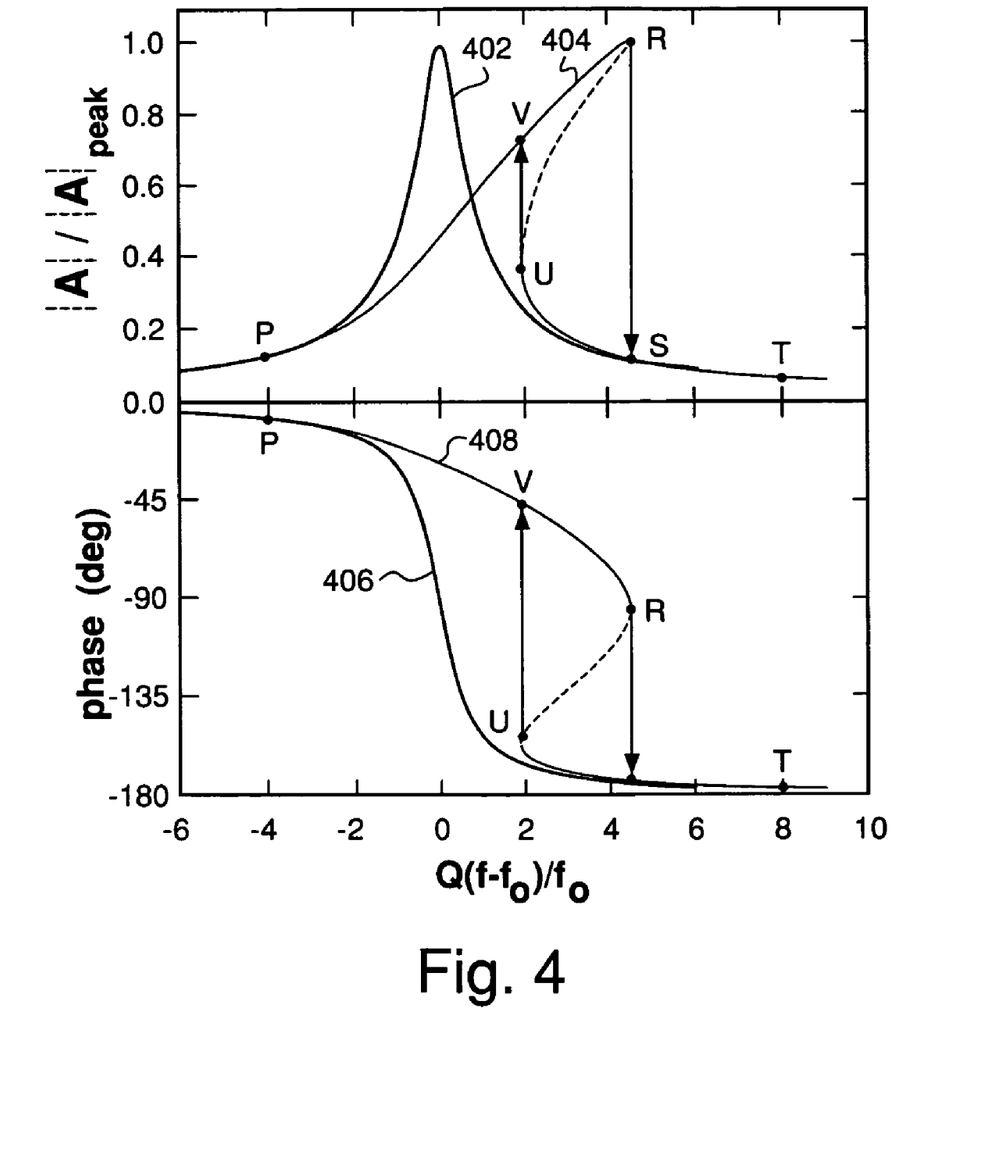
FIG. 4 graphically shows amplitudes and phases of linear and nonlinear oscillators as a function of frequency.

FIG. 4 graphically presents each of Eqs. (5) and (6) in a parameterized form. More specifically, curve 402 in the top panel of FIG. 4 corresponds to the normalized amplitude derived from Eq. (5), and curve 406 in the bottom panel of FIG. 4 corresponds to the phase given by Eq. (6). The following notations are used in FIG. 4: $2\pi f \equiv \omega$, and $A_{peak}$ is the maximum (resonant) amplitude corresponding to Eq. (5).

Noting that, at resonance, amplitude A is at its maximum and therefore:

$$\frac{\partial A^2}{\partial \omega} = 0 \quad (7)$$

and substituting Eq. (5) into Eq. (7), one finds that the circular frequency, $\omega_{res}$, corresponding to the resonance of an oscillator governed by Eq. (1) is given by Eq. (8) as follows:

$$\omega_{res} = \omega_o\sqrt{1 - \frac{1}{2Q^2}} \quad (8)$$

Combining Eqs. (6) and (8), one further finds that the phase, $\phi_{res}$, corresponding to the resonance of an oscillator governed by Eq. (1) is given by Eq. (9) as follows:

$$\phi_{res} = \tan^{-1}\left(-2Q\sqrt{1 - \frac{1}{2Q^2}}\right) \quad (9)$$

When Q is relatively large (e.g., >>1), Eqs. (8) and (9) can be reduced to $\omega_{res} \approx \omega_o$ and $\phi_{res} \approx -90$ degrees, respectively, where the displacement lags the driving force. A shift of $\Phi_{res}$ that is produced by a relatively small change in the value of the Q-factor is further given by Eq. (10) as follows:

$$\frac{\partial \omega_{res}}{\omega_o} \approx \frac{1}{Q^2}\frac{\partial Q}{Q} \quad (10)$$

It follows from Eq. (10) that, even for a relatively modest value of Q of about 100, a 1% change in the value of Q produces only about a 0.0001% shift in the value of $\omega_{res}$. An even smaller relative shift of $\omega_{res}$ is produced when Q>100.

For all practical purposes, the result of Eq. (10) means that, in a linear electromechanical resonator having a relatively large Q-factor, the resonant frequency is substantially independent of the Q-factor.

Motion of a damped nonlinear oscillator that is driven by a periodic driving force is governed by Eq. (11) as follows:

$$m\frac{d^2x}{dt^2} + \Gamma\frac{dx}{dt} + k_1 x + k_3 x^3 = F_o e^{i\omega t} \quad (11)$$

where x and t are the displacement and time, respectively; m is the mass; Γ is the damping coefficient; $k_1$ is the first-order (i.e., linear) spring constant; $k_3$ is the third-order (i.e., first nonlinear) spring constant; $F_0$ is the amplitude of the driving force; and ω is circular frequency. One skilled in the art will appreciate that, in general, a force generated by a nonlinear spring may be presented as a series of odd-order terms. For simplification purposes, the terms corresponding to orders higher than the third order are omitted from Eq. (11).

Assuming a solution analogous to that given by Eq. (4), one finds that the amplitude of the displacement is given by Eq. (12) as follows:

$$A^6 + \frac{2m\omega_o^2}{3k_3}\frac{\omega_o^2 - \omega^2}{\omega_o^2}A^4 + \frac{m^2\omega_o^4}{9k_3^2}\left[\left(\frac{\omega_o^2 - \omega^2}{\omega_o^2}\right)^2 + \frac{\omega^2}{\omega_o^2 Q^2}\right]A^2 - \frac{F_o^2}{9k_3^2} = 0 \quad (12)$$

Eq. (12) is cubic with respect to $A^2$ and, as such, can be solved using conventional analytical or numerical methods. Curve 404 in the top panel of FIG. 4 shows a representative solution of Eq. (12) as a function of parameterized value of frequency f.

Proceeding further, one finds that the phase of the displacement is given by Eq. (13) as follows:

$$\tan\phi = -\frac{\omega/\omega_o}{Q\left(\frac{\omega_o^2 - \omega^2}{\omega_o^2} + \frac{3k_3 A^2}{m\omega_o^2}\right)} \quad (13)$$

wherein $A^2$ is derived from Eq. (12). Curve 408 in the bottom panel of FIG. 4 shows a representative solution of Eq. (13) as a function of frequency.

Applying the condition of Eq. (7), one finds that, at resonance:

$$\frac{\omega_{res}^2}{\omega_o^2} = \frac{1}{2}\left(1 - \frac{3}{4Q^2}\right) + \sqrt{\frac{1}{4}\left(1 - \frac{1}{4Q^2}\right)^2 + \frac{3k_3 Q^2 F_o^2}{m^3 \omega_o^6}} \quad (14)$$

$$A_{peak}^2 = \frac{m\omega_o^2}{3k_3}\left[-\frac{1}{2}\left(1 - \frac{1}{4Q^2}\right) + \sqrt{\frac{1}{4}\left(1 - \frac{1}{4Q^2}\right)^2 + \frac{3k_3 Q^2 F_o^2}{m^3 \omega_o^6}}\right] \quad (15)$$

$$\tan\phi_{res} = -2Q\omega_{res}/\omega_o \quad (16)$$

When Q is relatively large (e.g., >>1), Eqs. (14)–(16) can be reduced to Eqs. (17)–(19) as follows:

$$\omega_{res} = \omega_o \left(1 + \frac{3}{2} \frac{k_3 Q^2 F_o^2}{m^3 \omega_o^6}\right) = \omega_o \left(1 + \frac{3}{2} \frac{k_3 A_{peak}^2}{m \omega_o^2}\right) \quad (17)$$

$$A_{peak} = Q \frac{F_o}{m \omega_o^2} \quad (18)$$

$$\phi_{res} = -90° \quad (19)$$

A shift of $\omega_{res}$ that is produced by a relatively small change in the value of the Q-factor is further given by Eq. (20) as follows:

$$\frac{\partial \omega_{res}}{\omega_o} = \frac{3k_3}{m\omega_o^2} A_{peak}^2 \frac{\partial Q}{Q} \quad (20)$$

It follows from Eq. (20) that the relative shift in the value of $\phi_{res}$ is proportional to the relative change in the value of Q. For all practical purposes, the result of Eq. (20) means that, in a nonlinear electromechanical resonator having a relatively large Q-factor, the resonant frequency does depend on the Q-factor. As such, changes in the Q-factor can be detected by monitoring the resonant frequency of the resonator.

B. Open-Loop versus Closed-Loop Operation:

During open-loop operation, the phase of the driving force and the phase of the displacement in a nonlinear oscillator governed by Eq. (11) are not forcefully fixed with respect to one another. As a result, the dashed portions of curves 404 and 408 of FIG. 4 are unstable, and the oscillator settles onto one of the stable (solid-line) branches of these curves. For example, when a frequency sweep starts at a state corresponding to point P (see FIG. 4) and proceeds toward higher frequencies, the state of the oscillator is determined by the branches of curves 404 and 408 between points P and R. When the frequency exceeds that of point R, the oscillator transitions from the state corresponding to point R to that of point S as shown by the corresponding vertical arrows in FIG. 4.

When the frequency increases further, e.g., from that of point S to that of point T, the state of the oscillator follows the branches of curves 404 and 408 between those points. Alternatively, when a frequency sweep starts at a state corresponding to point T and proceeds toward lower frequencies, the state of the oscillator is determined by the branches of curves 404 and 408 (FIG. 4) between points T and U. When the frequency falls below that of point U, the oscillator transitions from the state corresponding to point U to that of point V as shown by the corresponding vertical arrows in FIG. 4. When the frequency decreases further, e.g., from that of point V to that of point P, the state of the oscillator follows the branches of curves 404 and 408 between those points.

In contrast to open-loop operation, during closed-loop operation, the phase of the driving force and the phase of the displacement in a nonlinear oscillator governed by Eq. (11) are forcefully fixed with respect to one another. As a result, stable operation of the oscillator can be achieved at any point of curves 404 and 408. A theoretical discussion of this property of nonlinear oscillators is given in the article published in Physical Review A, 1995, vol. 51, pp. 4211–29, by B. Yurke, et al., the teachings of which are incorporated herein by reference. One practical implication of this property, e.g., for electromechanical resonator 202 (FIG. 2) coupled to DD circuit 304 (FIG. 3), is that the resonator and the DD circuit will operate in a stable manner close to resonance, e.g., in the vicinity of point R (FIG. 4), without any abrupt transitions corresponding to the vertical arrows shown in FIG. 4.

C. Fixed-Beam Oscillator:

Eqs. (1) and (11) assume that mass m and the spring are separate elements in the oscillator structure. However, for a fixed beam oscillator such as deformable beam 220 in resonator 202 (FIG. 2), the fixed beam is simultaneously both the mass and the spring. Due to this fact, a slight modification of Eqs. (17)–(19) is in order.

The third-order spring constant for a fixed beam of length l and constant cross-sectional area $A_{cs}$ is given by Eq. (21) as follows:

$$k_3 \approx 2\pi^2 \frac{A_{cs} E}{l^3} \quad (21)$$

where E is the Young's modulus. The distributed nature of the driving force acting upon the fixed beam results in a scaling factor of about 1.3195 for the force amplitude that has to be used in Eq. (18). The fundamental resonant frequency of the fixed beam is given by Eq. (22) as follows:

$$f_1 \equiv \frac{\omega_1}{2\pi} = \frac{1}{2\pi} \left(\frac{EI}{A_{cs}\rho}\right)^{1/2} \left(\frac{4.73}{l}\right)^2 \quad (22)$$

where I is the moment of the cross-sectional area generally defined as follows:

$$I = \int_{-w/2}^{w/2} dA \cdot x^2,$$

where $dA = h\, dx$, and $\rho$ is the density of the material used to form the beam. For a beam having a rectangular cross-section with a width w and a height h, the following equations apply:

$$I = \frac{hw^3}{12} \quad (23)$$

$$f_1 = 1.03 \left(\frac{E}{\rho}\right)^{1/2} \frac{w}{l^2} \quad (24)$$

Making appropriate substitutions in Eqs. (17)–(19), one arrives at Eqs. (25)–(27) as follows:

$$\omega_{res} = \omega_1 \left(1 + 0.72 \frac{|y_{mp}|^2_{peak}}{w^2}\right) \qquad (25)$$

$$|y_{mp}|_{peak} = Q \frac{1.3195|F|}{m\omega_1^2} \qquad (26)$$

$$\phi_{res} = -90° \qquad (27)$$

where $|y_{mp}|_{peak}$ is the amplitude of the middle-point displacement of the fixed beam at resonance, and $|F|$ is the amplitude of the driving force.

D. Relationship between Q-Factor, Resonant Frequency, and Magnetic Field:

As already indicated above, when a fixed beam such as deformable beam 220 in resonator 202 (FIG. 2) is a part of a closed current path, motion of the beam perpendicular to a magnetic field generates a current in the closed current path. Due to resistive losses in the closed current path, e.g., those in the resistor load connected between contact pads 224 and 226 in resonator 202 (FIG. 2) and/or deformable beam 220 itself, the power of the current will be dissipated into resistive heating, which will dampen oscillations of the beam. In addition to resistive losses, energy losses intrinsic to the beam and/or to the electromechanical resonator and energy losses corresponding to the beam's frictional interactions with ambient gas will also dampen oscillations of the beam. In general, an effective value of the Q-factor reflects all these losses and can be expressed, e.g., by Eq. (28) as follows:

$$Q^{-1} = Q_{int}^{-1} + Q_R^{-1} + Q_{gas}^{-1} \qquad (28)$$

where $Q_{int}$, $Q_R$, and $Q_{gas}$ are the Q-factors corresponding to intrinsic, resistive, and gas losses, respectively. Below, for simplification purposes, it is assumed that the resonator is placed in a high-vacuum environment so that the gas term is negligibly small.

The power, $\dot{q}_R$, dissipated in the closed current path is related to $Q_R$ as follows:

$$Q_R^{-1} = \frac{\dot{q}_R}{\omega_1 U} \qquad (29)$$

where U denotes the vibrational energy of the beam given by the following equation:

$$U \approx 0.20 m\omega_1^2 |y_{mp}|^2 \qquad (30)$$

Voltage V generated due to the motion of a conductor in magnetic field B is determined by the following equation:

$$V = \oint (\vec{v} \times \vec{B}) \cdot \vec{dl} \qquad (31)$$

where $\vec{v}$ is the velocity of a segment $\vec{dl}$. When the field is normal to the plane of resonator 202 this equation simplifies to:

$$|V| \approx 3.29 lfB |y_{mp}| \qquad (32)$$

Assuming that the impedance of the closed current path is dominated by resistive load $R_{load}$, the dissipated power is given by Eq. (33) as follows:

$$\dot{q}_R = \frac{|V|^2}{2R_{load}} \qquad (33)$$

Making appropriate substitutions in Eq. (29), one finds that:

$$Q_R \approx \frac{9.1 m f_1}{l^2 B^2} R_{load} \qquad (34)$$

Thus, for a fixed resistive load, $Q_R$ is inversely proportional to the magnetic field squared.

It will be shown below that an optimum magnetic-field sensitivity for the magnetometer is obtained near a certain value of $B \approx B_Q$, where $B_Q$ is defined by Eq. (35) as follows:

$$Q_{int} \approx \frac{9.1 m f_1}{l^2 B_Q^2} R_{load} \qquad (35)$$

Combining Eqs. (25), (26), (28), (34), and (35), one finds the relationship between the resonant frequency $f_{res}$ (where $2\pi f_{res} \equiv \omega_{res}$) and the magnetic field B given by Eq. (36) as follows:

$$\frac{f_{res} - f_1}{f_1} = 8.0 \times 10^{-4} \frac{Q_{int}^2}{\left(\left(\frac{B}{B_Q}\right)^2 + 1\right)^2} \left(\frac{|F|}{wmf_1^2}\right)^2 \qquad (36)$$

Eq. (36) provides that, for $B >> B_Q$, the difference between the current resonant frequency $f_{res}$ and the fundamental frequency $f_1$ is relatively small because the total damping is large and the beam amplitude is small. Alternatively, for $B << B_Q$, the difference asymptotically approaches a constant value because the total damping is dominated by the intrinsic term. The shift $\delta f$ of $f_{res}$ that is produced by a relatively small change $\delta B$ in the magnetic field is then obtained in a relatively straightforward manner by expressing Eq. (36) in a differential form and making appropriate substitutions and rearrangements. This shift is given by Eq. (37) as follows:

$$\frac{\delta B}{B} \approx \frac{1}{3}\left[1 + \left(\frac{B_Q}{B}\right)^2\right] \frac{\delta f_{res}}{f_1} \left(\frac{w}{|y_{mp}|}\right)^2 \qquad (37)$$

It follows from Eq. (37) that the sensitivity of the magnetometer will depend on the method used for the detection of the resonator's motion (e.g., for the measurement of $|y_{mp}|$) and also on the Q-factor of the resonator. Also note that since, according to Eq. (35), optimum resistance for the resistive load is proportional to $B_Q^2$, said resistance will become extremely small at very low fields, in which case one may have to cool the resonator and/or use superconducting materials.

E. Driving the Beam and Detecting its Motion:

Referring to FIG. 2, when the amplitude $|y_{mp}|$ for beam 220 is small compared to the gap ($g_D$) between the beam and drive electrode 232, the driving force F generated by voltage V that is applied to the drive electrode is given by Eq. (38) as follows:

$$F = \frac{C_D V^2}{2g_D} \quad (38)$$

where $C_D$ is the capacitance of the capacitor formed by beam 220 and drive electrode 232. When the drive signal applied to drive electrode 232 is a biased sinusoidal signal, the following conditions apply:

$$V = V_{dc} + |V_{ac}| \sin \omega t \quad (39a)$$

$$|V_{dc}| > |V_{ac}| \quad (39b)$$

When, in addition, $|V_{dc}| \gg |V_{ac}|$, the oscillating component ($F_{ac}$) of the driving force is given by Eq. (40) as follows:

$$F_{ac} \approx \frac{C_D V_{dc} |V|_{ac} \sin \omega t}{g_D}. \quad (40)$$

Eq. (40) confirms the statement made in the foregoing discussion of FIG. 3 that, for a biased drive signal 306, the driving force and, therefore, response signal 308 have the same frequency as the drive signal. Alternatively, when the drive signal applied to drive electrode 232 is a non-biased sinusoidal signal, $|V_{dc}| = 0$ and the driving force is given by Eq. (41) as follows:

$$F = \frac{C_D |V|_{ac}^2}{g_D} \frac{1 - \cos 2\omega t}{2} = \frac{C_D |V|_{ac}^2}{2g_D}[1 + \sin(2\omega_D t - \pi/2)]. \quad (41)$$

Eq. (41) confirms the statement made in the foregoing discussion of FIG. 3 that, for a non-biased drive signal 306, the driving force and, therefore, response signal 308 have a second harmonic of the drive signal.

Neglecting fringe-field effects and assuming that drive electrode 232 has the same length as beam 220, one arrives at the following expression for the capacitance $C_D$:

$$C_D = \varepsilon_o \frac{hl}{g_D} \quad (42)$$

where $\varepsilon_0$ is the permittivity of vacuum. Combining Eqs. (26), (41), and (42) and assuming that $$\alpha_D \equiv \frac{g_D}{l} \ll 1,$$

one obtains the following expression for $|y_{mp}|_{peak}$ as a function of drive voltage:

$$\frac{|y_{mp}|_{peak}}{w} = 0.0167 \frac{\varepsilon_o Q}{\rho (\alpha_D l w f_1)^2} |V_{ac}|^2 \quad (43)$$

Eq. (43) describes the relationship between drive signal 306 and the oscillation amplitude of beam 220.

When DD circuit 304 (FIG. 3) is coupled to resonator 202 (FIG. 2), the amplitude ($|V_d|$) of the oscillating component of response signal 308 can be expressed as follows:

$$\frac{|V_d|}{V_{bias}} \approx \frac{\Delta C_{total}}{C_{total}} \approx \frac{C_d}{C_d + C_{para}} \frac{|y_{mp}|}{g_d} \quad (44)$$

where $V_{bias}$, is the bias voltage generated by bias generator 312, $g_d$ is the gap between beam 220 and sense electrode 232 (FIG. 2), and $C_{total}$ is the total capacitance corresponding to sense electrode 242, which total capacitance includes the capacitance ($C_d$) of the capacitor formed by beam 220 and sense electrode 242 and any parasitic capacitance ($C_{para}$) in the circuit. When the parasitic capacitance is relatively small, Eq. (44) can be reduced to Eq. (45) as follows:

$$|V_d| \approx \frac{|y_{mp}|}{g_d} V_{bias} \quad (45)$$

Eq. (45) describes the relationship between the oscillation amplitude of beam 220 and response signal 308. Eq. (45) indicates that the amplitude of the oscillating component of response signal 308 is substantially proportional to the displacement amplitude of beam 220.

Although Eq. (45) seems to imply that response signal 308 can be made arbitrarily large by increasing the bias voltage and/or decreasing the gap between beam 220 and sense electrode 242, this is not the case since the tacit assumption underlying the above derivation is that the beam deformation due to the bias voltage does not significantly alter the gap. Clearly, the bias voltage will pull beam 220 toward sense electrode 242 and, at some critical voltage, the beam may abruptly snap down into contact with the sense electrode. The bias voltage is therefore limited by the snap-down voltage, which is approximated by Eq. (46) as follows:

$$V_{bias,max}^2 \approx V_{snapdown}^2 \approx 0.7 \frac{g_d^5 w E}{\varepsilon_o l^4} = 0.7 \frac{\alpha_d^5 l^5 \rho}{\varepsilon_o w} f_1^2 \quad (46)$$

where $$\alpha_d \equiv \frac{g_d}{l}.$$

F. Magnetometer Sensitivity:

The root-mean-square deviation ($\delta f$) of the measured frequency from the "real" frequency is determined by several factors, wherein the noise associated with the resonator's intrinsic loss (mostly thermal in nature) and the electronic noise emanating from the amplifier (e.g., amplifier 314 of FIG. 3) make two dominant contributions. Neglecting, for simplification purposes, all other contributions, δf can be expressed as follows:

$$\frac{\delta f}{f} = \sqrt{\left(\frac{\delta f}{f}\right)_{int}^2 + \left(\frac{\delta f}{f}\right)_{amp}^2} \quad (47)$$

where indices int and amp correspond to the resonator's intrinsic noise and the amplifier noise, respectively. An expression for the magnetometer sensitivity can then be obtained in a relatively straightforward manner by combining Eqs. (37) and (47).

When the resonator is detached from the DD circuit, relative deviation of the measured frequency from the mean frequency can be determined as follows:

$$\frac{\delta f}{f} = \sqrt{\frac{1}{Q}\frac{1}{Q_{filter}}\left(\frac{k_B T}{U}\right)} \quad (48)$$

where $k_B$ is the Boltzmann constant, T is temperature, and $Q_{filter}$ is given by the following expression:

$$\frac{1}{Q_{filter}} \equiv \frac{\Delta \nu}{\omega_1} = \frac{1}{\omega_1 \tau} \quad (49)$$

where γν is the filter bandwidth and τ is the measurement time. Combining Eqs. (30), (48), and (49), one arrives at the following expression for the contribution into δf of the noise associated with the resonator's intrinsic loss:

$$\left(\frac{\delta f}{f}\right)_{int} \approx \sqrt{\frac{5 k_B T}{8 Q \omega_1^3 m |y_{mp}|^2 \tau}} \quad (50)$$

At the peak of a resonance curve, phase diffusion due to the amplifier output-port noise is independent of the strength of the nonlinearity and is given by the following equation derived in the above-cited Physical Review article by B. Yurke, et al.:

$$(\delta f)^2 = \frac{v_{rms}^2}{4\tau_T^2 \langle V_d^2 \rangle} \frac{1}{4\pi^2 \tau} \quad (51)$$

where $v_{rms}$ represents the root-mean-square fluctuation of white voltage noise per root Hertz, and $\tau_T$ is the amplitude ring-down time of the resonator when connected to the DD circuit. Noting that $\tau_T$ can be expressed as $$\tau_T = \frac{2Q}{\omega},$$

one arrives at the following expression for the contribution into δf of the amplifier noise:

$$\left(\frac{\delta f}{f}\right)_{amp}^2 = \frac{v_{rms}^2/\tau}{16 Q^2 \langle V_d^2 \rangle} \quad (52)$$

It follows from Eqs. (37), (47), (50), and (52) that, when the intrinsic noise dominates, the magnetometer sensitivity is governed by the following expression:

$$\frac{\delta B}{B} \propto \frac{B}{B_Q}\left[1 + \left(\frac{B_Q}{B}\right)^2\right]^{3/2} \quad (53)$$

Alternatively, when the amplifier noise dominates, the magnetometer sensitivity is governed by the following expression:

$$\frac{\delta B}{B} \propto \left(\frac{B_Q}{B}\right)^2 \left[1 + \left(\frac{B}{B_Q}\right)^2\right]^2 \quad (54)$$

While Eq. (53) has a minimum at $B=2^{1/2}B_Q$, Eq. (54) has a minimum at $B=B_Q$. These minima correspond to respective optimum regions of operation for the magnetometer.

As further demonstrated below, at relatively low magnetic fields, a significant improvement in the magnetometer sensitivity can be achieved by placing the resonator in a bias magnetic field, $B_{bias}$. The bias magnetic field may, for example, be provided by a permanent magnet attached to the resonator support structure. The total magnetic field, B, acting upon the resonator is then a sum of the bias magnetic field and an external magnetic field, b, that is monitored with the magnetometer. The relative variation in the total field is then given by Eq. (55) as follows:

$$\frac{\delta B}{B} = \frac{\delta b}{b + B_{bias}} \quad (55)$$

Rearranging this equation, one arrives at the following expression:

$$\frac{\delta b}{b} = \left(1 + \frac{B_{bias}}{b}\right)\frac{\delta B}{B} \quad (56)$$

where δB/B is given by Eq. (37). When $b \ll B_{bias}$ and $B_{bias} \approx B_Q$, Eq. (56) simplifies to Eq. (57) as follows:

$$\frac{\delta b}{b} = \frac{B_Q}{B}\frac{\delta B}{B} \quad (57)$$

When the intrinsic noise dominates, the ratio of sensitivities with and without the bias magnetic field can be obtained using Eqs. (50) and (57). A representative result for $B_{bias}=B_Q$ is given by Eq. (58) as follows:

$$\frac{\left.\frac{\delta b}{b}\right|_{B_{bias}=0}}{\left.\frac{\delta b}{b}\right|_{B_{bias}=B_Q}} \approx \frac{1}{2^{3/2}}\left(\frac{B_Q}{b}\right) \quad (58)$$

Alternatively, when the amplifier noise dominates, the ratio of sensitivities with and without the bias magnetic field can be obtained using Eqs. (52) and (57). A representative result for $B_{bias}=B_Q$ is given by Eq. (59) as follows:

$$\frac{\left.\frac{\delta b}{b}\right|_{B_{bias}=0}}{\left.\frac{\delta b}{b}\right|_{B_{bias}=B_Q}} \approx \frac{1}{4}\left(\frac{B_Q}{b}\right) \quad (59)$$

Eqs. (58) and (59) indicate that the presence of a bias magnetic field tends to increase the magnetometer sensitivity (i.e., decrease the detectable value of $\delta b$) at relatively low external fields.

EXAMPLES

A. Example 1:

Suppose that one wants to monitor variations in the Earth's magnetic field (which has a strength of about 0.5 gauss) and, based on fabrication, vacuum, vibration, and/or electronics issues, requires a relatively high value for $f_1$ e.g., $f_1=20$ kHz. Then, resonator 202 satisfies this requirement when beam 220 is implemented, e.g., using the following parameters: w=1 μml; l=620 μm; h=7.75 μm. Using the conductivity of doped silicon (i.e., the material of beam 220), one finds that the beam has a resistance of about 800 Ohm. If this resistance is the load resistance (e.g., contact pads 224 and 226 are simply connected by a well-conducting wire) and $Q_{int}=10^5$, then $B_Q=1670$ gauss. Alternatively, when beam 220 is covered by a film of gold that is about 0.6 μm thick, then $R_{load} \approx R_{gold} \approx 26$ Ohm and $B_Q=300$ gauss. Selecting $g_d=g_D=15.5$ μm and using Eq. (46), one also finds that the maximum bias voltage for bias generator 312 is about 120 V.

Figure 5:
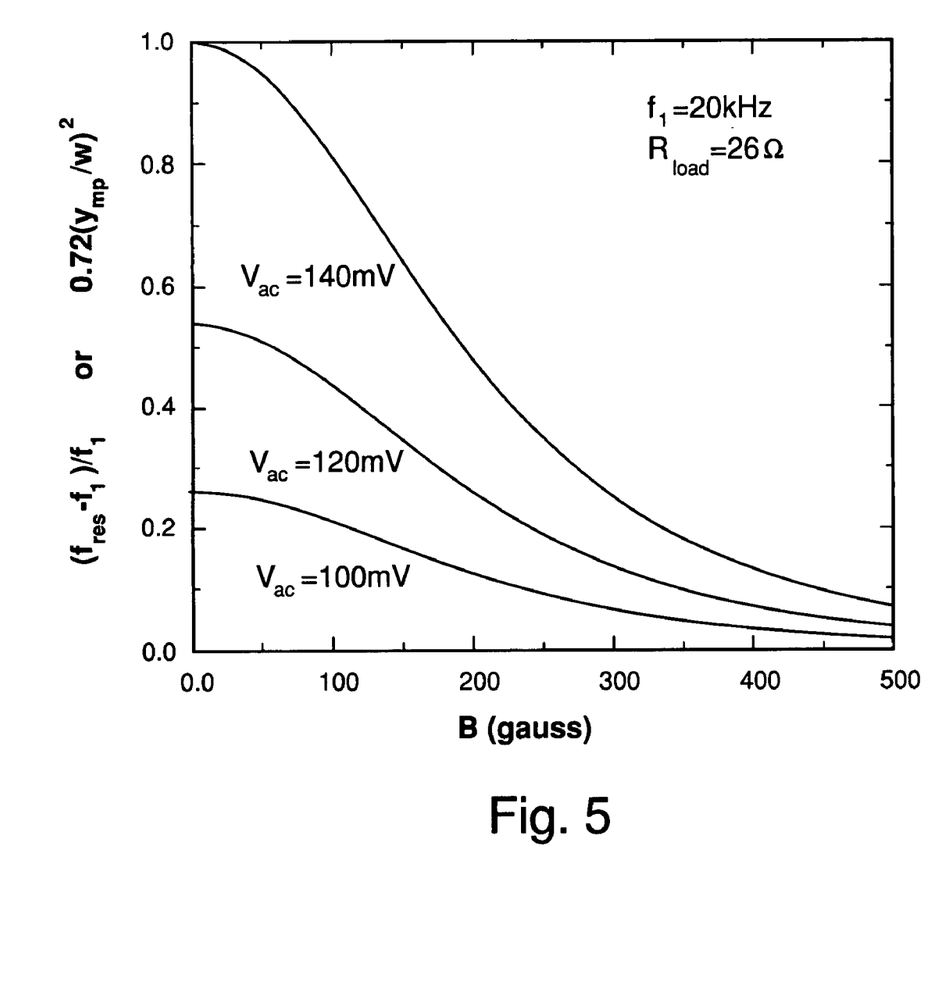
FIG. 5 graphically shows resonant frequency as a function of the magnetic field strength in one implementation of the resonator shown in FIG. 2.

FIG. 5 graphically shows resonant frequency as a function of the magnetic-field strength in resonator 202 implemented with the parameters of this example. Different curves in FIG. 5 correspond to different amplitudes ($V_{ac}$) of the drive signal applied to drive electrode 232. FIG. 5 indicates that, for example, for $V_{ac}=140$ mV, the resonant frequency of resonator 202 shifts from about 40 kHz to about 22 kHz when the magnetic-field strength changes from about 0 to about 500 gauss. FIG. 5 further indicates that the best sensitivity to magnetic field variations is achieved between about 100 gauss and about 350 gauss.

Figure 6:
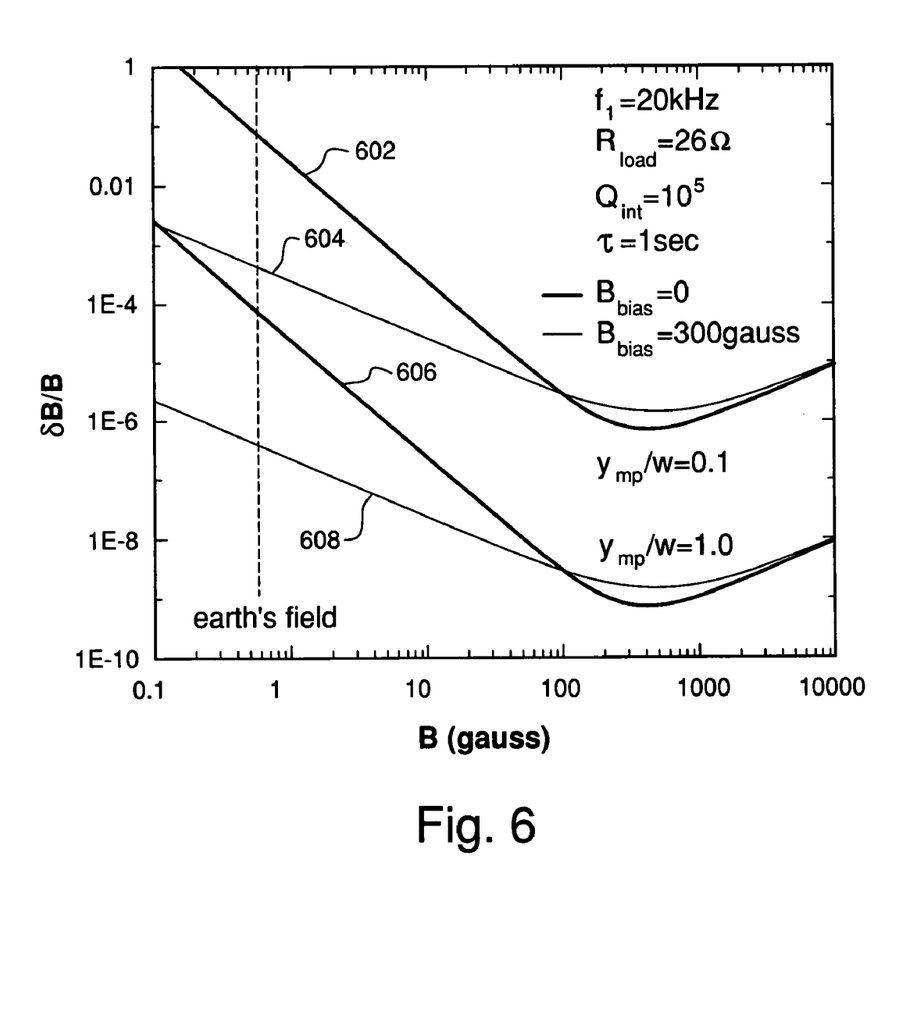
FIG. 6 graphically shows magnetometer sensitivity as a function of the magnetic field strength for the resonator implementation illustrated in FIG. 5.

FIG. 6 graphically shows magnetometer sensitivity as a function of the magnetic-field strength for resonator 202 that is implemented with the above-indicated parameters of this example. Curves 602 and 604 correspond to a drive signal resulting in $y_{mp}=0.1$, and curves 606 and 608 correspond to a drive signal resulting in $y_{mp}/w=1.0$. Curves 602 and 606 represent a configuration in which $B_{bias}=0$, and curves 604 and 608 represent a configuration in which $B_{bias}=300$ gauss. FIG. 6 indicates that application of a bias magnetic field significantly improves the magnetometer sensitivity for measurements of relatively low magnetic fields, e.g., B<10 gauss. For example, when the resonator is driven with $y_{mp}/w=1.0$ in an external magnetic field of about 0.5 gauss, the magnetometer sensitivity is about 100 ppm without the bias field and about 1 ppm with the bias field. An optimum sensitivity of about 0.001 ppm is achieved, with or without the bias field, at external field strengths of about 300 gauss.

B. Example 2

The region of optimum sensitivity for resonator 202 can be shifted toward lower fields by implementing the resonator with a relatively low value of $f_1$, e.g., $f_1=2$ kHz. Resonator 202, in which beam 220 has the following dimensions: w=10 μm; l=6200 μm; and h=77.5 μm, meets this specification. When beam 220 is covered by a film of gold that is about 2 μm thick, $R_{gold} \approx 7.4$ Ohm and $B_Q=160$ gauss.

Figure 7:
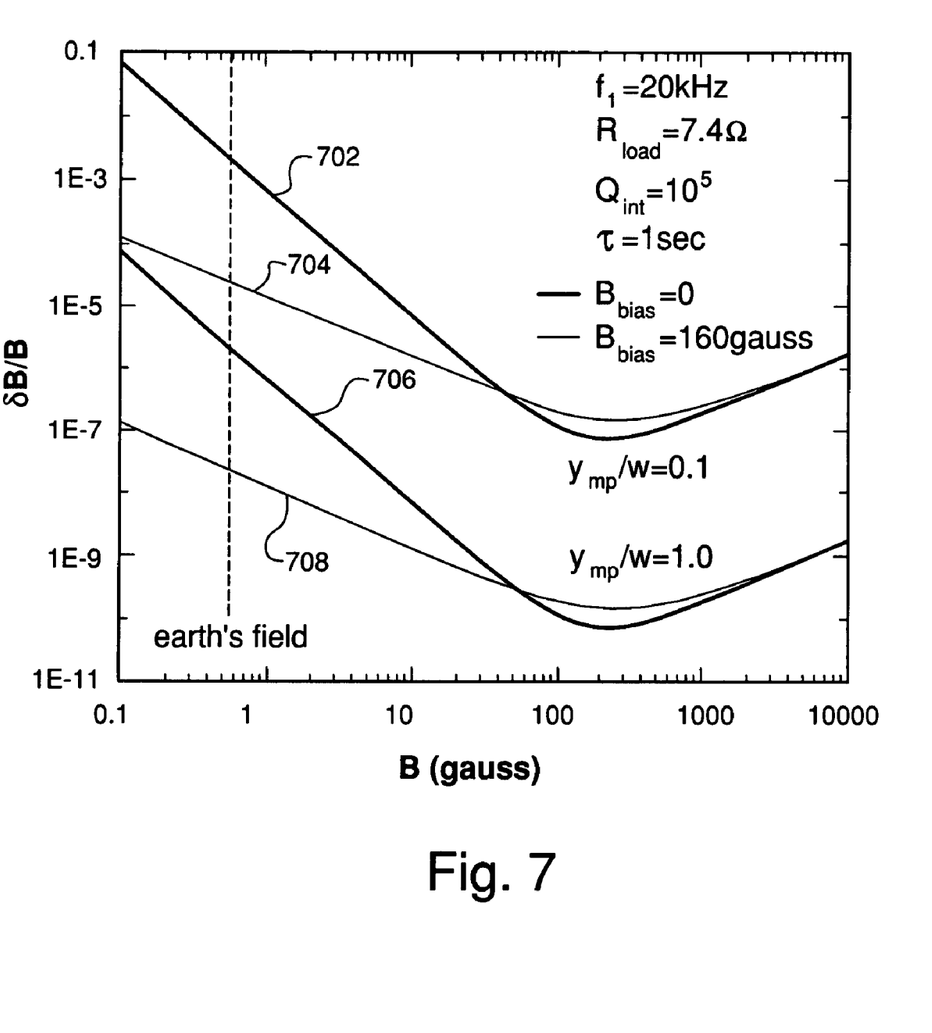
FIG. 7 graphically shows magnetometer sensitivity as a function of the magnetic field strength for another implementation of the resonator shown in FIG. 2.

FIG. 7 graphically shows magnetometer sensitivity as a function of the magnetic-field strength for resonator 202 that is implemented with the above-indicated parameters of this example. Curves 702 and 704 correspond to a drive signal resulting in $y_{mp}/w=0.1$, and curves 706 and 708 correspond to a drive signal resulting in $y_{mp}/w=1.0$. Curves 702 and 706 represent a configuration in which $B_{bias}=0$, and curves 704 and 708 represent a configuration in which $B_{bias}=160$ gauss. FIG. 7 indicates, for example, that, when the resonator is driven with $y_{mp}/w=1.0$ in an external magnetic field of about 0.5 gauss, the magnetometer sensitivity is about 1 ppm without the bias field and about 0.01 ppm with the bias field. An optimum sensitivity of about $10^{-4}$ ppm is achieved, with or without the bias field, at external field strengths of about 200 gauss.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

Although electromechanical resonators of the invention have been described in the context of silicon/silicon oxide SOI wafers, other suitable materials, such as germanium-compensated silicon, may similarly be utilized. The materials may be appropriately doped as known in the art. Various surfaces may be modified, e.g., by metal deposition for enhanced electrical conductivity or by ion implantation for enhanced mechanical strength. Differently shaped electrodes, pads, tracks, grooves, openings, and support structures may be implemented without departing from the scope and principle of the invention. Deformable beams may have different shapes and sizes, where the term "beam" refers in general to any suitable elastic structure that can recover its original shape after being distorted. A different number of electrodes may be used in a resonator of the invention without departing from the scope and principles of the invention. Two or more resonators of the invention may be arrayed and/or integrated on a chip with other circuitry, e.g., a DD circuit, as necessary and/or apparent to a person skilled in the art. Two or more variously oriented resonators of the invention may be incorporated into a magnetometer to enable the magnetometer to sense variously oriented magnetic fields.

For the purposes of this specification, a MEMS device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. The scale/size of certain elements in a MEMS device may be such as to permit manifestation of quantum effects. Examples of MEMS devices include, without limitation, NEMS (nano-electromechanical systems) devices, MOEMS (micro-opto-electromechanical systems) devices, micromachines, Microsystems, and devices produced using microsystems technology or microsystems integration.

Although the present invention has been described in the context of implementation as MEMS devices, the present invention can in theory be implemented at any scale, including scales larger than micro-scale.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. A device, comprising:
    a resonator having a deformable beam adapted to oscillate such that, when the resonator is subjected to a magnetic field, the resonant frequency of the oscillation of the deformable beam is a function of the magnetic-field strength, wherein the device is adapted to generate, based on the resonant frequency, a signal indicative of the magnetic-field strength; and
    a drive-and-detect (DD) circuit coupled to the resonator, wherein the DD circuit is adapted to (i) generate a drive signal applied to the resonator, which drive signal induces the oscillation, and (ii) receive a response signal generated by the resonator due to the oscillation, wherein the resonant frequency corresponds to a maximum amplitude of the response signal.

2. The invention of claim 1, wherein the deformable beam is a part of a closed current path, wherein:
    the oscillation of the deformable beam is adapted to change a magnetic flux through the closed current path, thereby generating an electrical current in the closed current path; and
    dissipation of the electrical current due to resistive losses in the closed current path affects the resonant frequency.

3. The invention of claim 1, wherein the DD circuit is adapted to sweep frequency of the drive signal to determine the resonant frequency.

4. The invention of claim 1, wherein the DD circuit is adapted to automatically lock onto and operate at the resonant frequency.

5. The invention of claim 1, wherein the DD circuit is adapted to maintain a fixed relationship between a phase of the drive signal and a phase of the response signal.

6. The invention of claim 5, wherein the response signal lags the drive signal by about 90 degrees.

7. The invention of claim 1, wherein the response signal has a second harmonic of the drive signal.

8. The invention of claim 1, wherein the DD circuit comprises:
    a generator adapted to generate the drive signal;
    an amplifier adapted to amplify the response signal;
    a phase shifter adapted to generate a phase-shifted signal based on the amplified signal; and
    a control circuit adapted to measure amplitude of the amplified signal and, based on the measurement, provide a first control signal to the generator, wherein the generator is adapted to generate the drive signal based on the first control signal and the phase-shifted signal.

9. The invention of claim 8, wherein the generator is adapted to set frequency of the drive signal based on the first control signal.

10. The invention of claim 8, wherein:
    the control circuit is further adapted to generate a second control signal; and
    the phase shifter is adapted to generate the phase-shifted signal based on the second control signal.

11. The invention of claim 8, wherein the DD circuit further comprises a frequency divider coupled between the amplifier and the phase shifter.

12. The invention of claim 8, wherein the control circuit is adapted to generate the first control signal such that the amplitude of the amplified signal is substantially maximized, wherein the resonant frequency corresponds to the maximized amplitude of the amplified signal.

13. The invention of claim 8, wherein the DD circuit further comprises a bias voltage generator adapted to bias the response signal.

14. The invention of claim 1, wherein the deformable beam is implemented in a MEMS device.

15. The invention of claim 14, wherein the MEMS device comprises a conducting track electrically connected to the deformable beam, wherein:
    the deformable beam and the conducting track are parts of a closed current path;
    the oscillation of the deformable beam is adapted to change a magnetic flux through the closed current path, thereby generating an electrical current in the closed current path; and
    dissipation of the electrical current due to resistive losses in the closed current path affects the resonant frequency.

16. The invention of claim 15, wherein:
    the deformable beam is electrically coupled to a first terminal of a resistive load;
    the conducting track is electrically coupled to a second terminal of the resistive load; and
    the closed current path includes the resistive load.

17. The invention of claim 15, wherein the deformable beam comprises a metal film electrically connected to the conducting track.

18. The invention of claim 14, wherein the MEMS device comprises a first electrode adapted to induce the oscillation of the deformable beam.

19. The invention of claim 18, wherein the MEMS device comprises a second electrode adapted to sense the oscillation of the deformable beam.

20. The invention of claim 19, wherein:
the MEMS device is fabricated using a layered wafer; and
the deformable beam, the first electrode, and the second electrode are fabricated using a single layer of the layered wafer.

21. A MEMS device, comprising a deformable beam supported on a substrate and adapted to be a first part of a closed current path, wherein the deformable beam is adapted to oscillate such that, when the closed current path is subjected to a magnetic field, the resonant frequency of the oscillation of the deformable beam is a function of the magnetic-field strength.

22. The invention of claim 21, wherein:
the oscillation of the deformable beam is adapted to change a magnetic flux through the closed current path, thereby generating an electrical current in the closed current path; and
dissipation of the electrical current due to resistive losses in the closed current path affects the resonant frequency.

23. The invention of claim 21, wherein the MEMS device comprises a conducting track electrically connected to the deformable beam, wherein the conducting track is adapted to be a second part of the closed current path.

24. The invention of claim 23, wherein:
the deformable beam is adapted to be electrically coupled to a first terminal of a resistive load;
the conducting track is adapted to be electrically coupled to a second terminal of the resistive load; and
the closed current path includes the resistive load.

25. The invention of claim 23, wherein the deformable beam comprises a metal film electrically connected to the conducting track.

26. The invention of claim 21, wherein the MEMS device comprises a first electrode adapted to induce the oscillation of the deformable beam.

27. The invention of claim 26, wherein the MEMS device comprises a second electrode adapted to sense the oscillation of the deformable beam.

28. The invention of claim 27, wherein:
the MEMS device is fabricated using a layered wafer; and
the deformable beam, the first electrode, and the second electrode are fabricated using a single layer of the layered wafer.

29. A method of measuring a magnetic field, comprising:
inducing an oscillation of a deformable beam, wherein the deformable beam is a part of a closed current path;
sensing the oscillation, wherein, when the closed current path is subjected to the magnetic field, resonant frequency of the oscillation is a function of the magnetic-field strength; and
determining the magnetic-field strength based on the resonant frequency.

30. The invention of claim 29, wherein:
the oscillation of the deformable beam changes a magnetic flux through the closed current path, thereby generating an electrical current in the closed current path; and
dissipation of the electrical current due to resistive losses in the closed current path affects the resonant frequency.

31. The invention of claim 29, further comprising changing frequency of the oscillation to determine the resonant frequency.

32. The invention of claim 29, wherein:
the oscillation is induced using a drive signal and sensed via a response signal; and
the method comprises maintaining a fixed relationship between a phase of the drive signal and a phase of the response signal.

33. The invention of claim 32, wherein the response signal lags the drive signal by about 90 degrees.

34. The invention of claim 29, wherein the magnetic field, to which the closed current path is subjected, comprises a bias magnetic field.

35. The invention of claim 29, wherein the deformable beam is placed in a vacuum.

36. Apparatus, comprising:
a deformable beam that is a part of a closed current path;
means for inducing an oscillation of the deformable beam;
means for sensing the oscillation, wherein, when the closed current path is subjected to a magnetic field, resonant frequency of the oscillation is a function of the magnetic-field strength; and
means for determining the magnetic-field strength based on the resonant frequency.

37. A device, comprising a resonator having a deformable beam adapted to oscillate such that, when the resonator is subjected to a magnetic field, the resonant frequency of the oscillation of the deformable beam is a function of the magnetic-field strength, wherein:
the device is adapted to generate, based on the resonant frequency, a signal indicative of the magnetic-field strength; and
the deformable beam is a part of a closed current path, wherein:
the oscillation of the deformable beam is adapted to change a magnetic flux through the closed current path, thereby generating an electrical current in the closed current path; and
dissipation of the electrical current due to resistive losses in the closed current path affects the resonant frequency.

38. A device, comprising a resonator having a deformable beam adapted to oscillate such that, when the resonator is subjected to a magnetic field, the resonant frequency of the oscillation of the deformable beam is a function of the magnetic-field strength, wherein:
the device is adapted to generate, based on the resonant frequency, a signal indicative of the magnetic-field strength;
the deformable beam is implemented in a MEMS device; and
the MEMS device comprises a conducting track electrically connected to the deformable beam, wherein:
the deformable beam and the conducting track are parts of a closed current path;
the oscillation of the deformable beam is adapted to change a magnetic flux through the closed current path, thereby generating an electrical current in the closed current path; and
dissipation of the electrical current due to resistive losses in the closed current path affects the resonant frequency.

39. The invention of claim 38, wherein:
the deformable beam is electrically coupled to a first terminal of a resistive load;
the conducting track is electrically coupled to a second terminal of the resistive load; and
the closed current path includes the resistive load.

40. The invention of claim 38, wherein the deformable beam comprises a metal film electrically connected to the conducting track.

41. A device, comprising a resonator having a deformable beam adapted to oscillate such that, when the resonator is subjected to a magnetic field, the resonant frequency of the oscillation of the deformable beam is a function of the magnetic-field strength, wherein:

the device is adapted to generate, based on the resonant frequency, a signal indicative of the magnetic-field strength;

the deformable beam is implemented in a MEMS device;

the MEMS device comprises a first electrode adapted to induce the oscillation of the deformable beam;

the MEMS device comprises a second electrode adapted to sense the oscillation of the deformable beam;

the MEMS device is fabricated using a layered wafer; and the deformable beam, the first electrode, and the second electrode are fabricated using a single layer of the layered wafer.

* * * * *